(12) United States Patent
Thakur

(10) Patent No.: US 6,808,758 B1
(45) Date of Patent: Oct. 26, 2004

(54) PULSE PRECURSOR DEPOSITION PROCESS FOR FORMING LAYERS IN SEMICONDUCTOR DEVICES

(75) Inventor: Randhir P. S. Thakur, San Jose, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/590,464

(22) Filed: Jun. 9, 2000

(51) Int. Cl.[7] .................... C23C 16/455; C23C 16/46
(52) U.S. Cl. .................. 427/559; 427/557; 427/582; 427/583; 427/584; 427/593; 427/255.15; 427/255.7; 427/379; 118/724; 117/89; 117/105; 438/680; 438/792
(58) Field of Search ............... 427/380, 398.4, 427/553, 557, 558, 559, 582, 583, 584, 585, 587, 593, 248.1, 255.15, 255.7, 379, 487, 492, 497, 599, 509, 581, 592; 118/715, 724, 725, 641, 642; 117/88–89, 93, 105, 3, 84, 102, 104; 438/680, 681, 788, 792, 761

(56) References Cited

U.S. PATENT DOCUMENTS

| | | | |
|---|---|---|---|
| 4,670,063 A | * | 6/1987 | Schachameyer et al. .... 117/103 |
| 4,678,536 A | * | 7/1987 | Murayama et al. ......... 117/108 |
| 4,913,929 A | | 4/1990 | Moslehi et al. |
| 4,989,544 A | | 2/1991 | Yoshikawa |
| 5,269,847 A | | 12/1993 | Anderson et al. |
| 5,308,651 A | * | 5/1994 | Ohta et al. ................... 427/582 |
| 5,311,055 A | * | 5/1994 | Goodman et al. .......... 257/584 |
| 5,443,033 A | * | 8/1995 | Nishizawa et al. ........... 117/86 |
| 5,451,260 A | | 9/1995 | Versteeg et al. |
| 5,495,822 A | * | 3/1996 | Utsumi et al. ................. 117/1 |
| 5,705,224 A | * | 1/1998 | Murota et al. ........... 427/248.1 |
| 5,710,407 A | * | 1/1998 | Moore et al. ................ 219/405 |
| 5,820,942 A | | 10/1998 | Singh et al. |
| 5,863,327 A | * | 1/1999 | Thakur ....................... 118/50.1 |
| 5,965,219 A | * | 10/1999 | Hayashi et al. ............. 427/586 |
| 5,970,382 A | | 10/1999 | Shah |
| 5,972,430 A | * | 10/1999 | DiMeo, Jr. et al. ..... 427/255.32 |
| 5,980,637 A | | 11/1999 | Singh et al. |
| 6,124,158 A | * | 9/2000 | Dautartas et al. ........... 438/216 |
| 6,174,651 B1 | | 1/2001 | Thakur |
| 6,203,613 B1 | * | 3/2001 | Gates et al. ................ 117/104 |
| 6,320,213 B1 | * | 11/2001 | Kirlin et al. ................ 257/295 |
| 6,420,251 B1 | * | 7/2002 | Elmadjian et al. .......... 438/597 |

* cited by examiner

Primary Examiner—Shrive P. Beck
Assistant Examiner—Wesley D. Markham
(74) Attorney, Agent, or Firm—Dority & Manning, P.A.

(57) ABSTRACT

A process for producing thin layers in electronic devices such as integrated circuit chips, is provided. The process includes the steps of injecting a precursor fluid into a thermal processing chamber containing a substrate, such as a semiconductor wafer. The precursor fluid is converted into a solid which forms a layer on the substrate. In accordance with the present invention, the precursor fluid is pulsed into the process chamber in a manner such that the fluid is completly exhausted or removed from the chamber in between each pulse. Light energy can be used in forming the solid layers.

23 Claims, 4 Drawing Sheets

PULSE PRECURSOR DEPOSITION PROCESS FOR FORMING LAYERS IN SEMICONDUCTOR DEVICES

FIELD OF THE INVENTION

The present invention is generally directed to a process for forming layers in electronic devices, such as in integrated circuit chips. The layers formed according to the present invention can be conductive layers, semiconductive layers, or insulating layers.

BACKGROUND OF THE INVENTION

In general, an integrated circuit refers to an electrical circuit contained on a single monolithic chip containing active and passive circuit elements. Integrated circuits are fabricated by diffusing and depositing successive layers of various materials in a preselected pattern on a substrate. The materials can include semiconductive materials such as silicon, conductive materials such as metals, and low dielectric materials such as silicon dioxide. Of particular significance, the semiconductive materials contained in integrated circuit chips are used to form almost all of the ordinary electronic circuit elements, such as resistors, capacitors, diodes, and transistors.

Integrated circuits are used in great quantities in electronic devices, such as digital computers, because of their small size, low power consumption, and high reliability. The complexity of integrated circuits range from simple logic gates and memory units to large arrays capable of complete video, audio and print data processing. Presently, however, there is a demand for integrated circuit chips to accomplish more tasks in a smaller space while having even lower operating voltage requirements.

As stated above, integrated circuit chips are manufactured by successively depositing layers of different materials on a substrate. Typically, the substrate is made from a thin slice or wafer of silicon. The active and passive components of the integrated circuit are then built on top of the substrate. The components of the integrated circuit can include layers of different conductive materials such as metals and semiconductive materials surrounded by low dielectric insulator materials. In attempting to improve integrated circuit chips, attention has been focused upon reducing the thickness of the layers while improving performance.

As such, a need currently exists for a process for producing thin layers in electrical devices that are uniform and have improved electrical properties.

SUMMARY OF THE INVENTION

In general, the present invention is directed to a process for forming layers in electronic devices, such as integrated circuit chips. The process includes the steps of first placing a substrate in a reaction chamber. The substrate can be, for instance, a semiconductor wafer. The reaction chamber, on the other hand, can be a rapid thermal processing chamber that is heated by an array of light energy sources positioned outside the chamber. The chamber can also include other energy sources, such as a resistance heater placed adjacent to the substrate, a plasma source, a microwave device, and the like.

Once the substrate is placed within the reaction chamber, a precursor fluid is pulsed into the chamber. Once pulsed into the chamber, the precursor fluid is exposed to heat and/or light energy at low pressure causing the precursor fluid to convert into a solid layer on the substrate. In general, the precursor fluid can be any gas, vapor or flowable reactant capable of forming a desired coating within the chamber.

In accordance with the present invention, the precursor fluid is substantially exhausted and removed from the reaction chamber in between each pulse of the precursor fluid. As such, each pulse of the precursor fluid forms a very thin layer on the substrate. As each pulse enters the chamber, the layer on the substrate is built up to the desired thickness. Through this process, very thin but uniform layers can be formed on substrates without a significant amount of defects.

In most applications, it is important that the pressure within the chamber be maintained very low during introduction of the precursor fluid. For instance, the pressure in the chamber can be less than about 5 torr, particularly less than about 3 torr, and more particularly less than about 1 torr. Introducing the precursor fluid or reactants at low pressure facilitates formation of the solid coating on the substrate.

The precursor fluid introduced into the reaction chamber can be a gas, a liquid vapor, a mixture of gases, a mixture of liquid vapors, or a mixture of gases and vapors. Further, when the precursor fluid includes a mixture of reactants, the reactants can be mixed outside of the chamber or within the chamber itself. Through the process of the present invention, the precursor fluid can be used to form conductive layers, semiconductive layers, and dielectric layers. For example, the precursor fluid can be a reactive hydride for forming various layers such as metal layers. Particular examples of layers that can be formed include zirconium hafnium oxide, tungsten, tungsten nitride, tantalum nitride, titanium nitride, copper, aluminum, silver, and the like. Other layers that can be formed include zirconium oxide, silicates, or any suitable ternary compound.

The process of the present invention can be varied depending upon the particular type of material to be deposited on the substrate. For example, in one embodiment, the precursor fluid can be converted into the solid coating using only light energy. The light energy can be intermittently emitted into the reaction chamber in substantial synchronization with the pulsating precursor fluid. In order to ensure that substantially no precursor fluid remains in the reaction chamber after a single pulse, an inert gas can be introduced into the reaction chamber in between the pulses of the precursor fluid. The inert gas, which can be, for instance, argon, helium, or nitrogen, can purge from the reaction chamber any precursor fluid not converted into a solid material.

In another embodiment of the present invention, the substrate can be heated by an electrical resistance heater placed adjacent to the substrate during the deposition process to assist in formation of the solid coating. For example, the precursor fluid can be pulsed into the reaction chamber and converted into a solid coating on the substrate as the substrate is heated by the resistance heater. After formation of the solid layer, the layer can then be exposed to light energy in order to repair defects that may have formed or to stabilize the stoichiometry of the layer.

In another embodiment, the precursor fluid can be pulsed into the reaction chamber and immediately exposed to light energy for forming the solid layer. After each pulse, the light energy sources can be decreased or turned off and the reaction chamber can be purged with an inert gas. If desired, the inert gas can be introduced into the chamber at a temperature lower than the substrate in order to assist in cooling the formed layer. After the inert gas has purged any remaining precursor fluid not converted Into a solid material, the light energy sources can once again be activated in order to anneal the formed layer. This process can then be repeated in order to build up the thickness of the layer. Such an alternative heating and deposition process results in a pin hole free film.

For most applications, preferably the process of the present invention is desirably carried out in a cold wall reaction chamber. As used herein, a cold wall reaction chamber refers to a reaction chamber in which the walls are maintained at a temperature lower than the heated substrate. For Instance, the walls can be made from a insulating material that does not substantially heat up when exposed to light energy. Alternatively, the walls of the reaction chamber can be cooled, such as by circulating a cooling fluid through or around the walls of the chamber.

Other features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures, in which.

Figure 1:
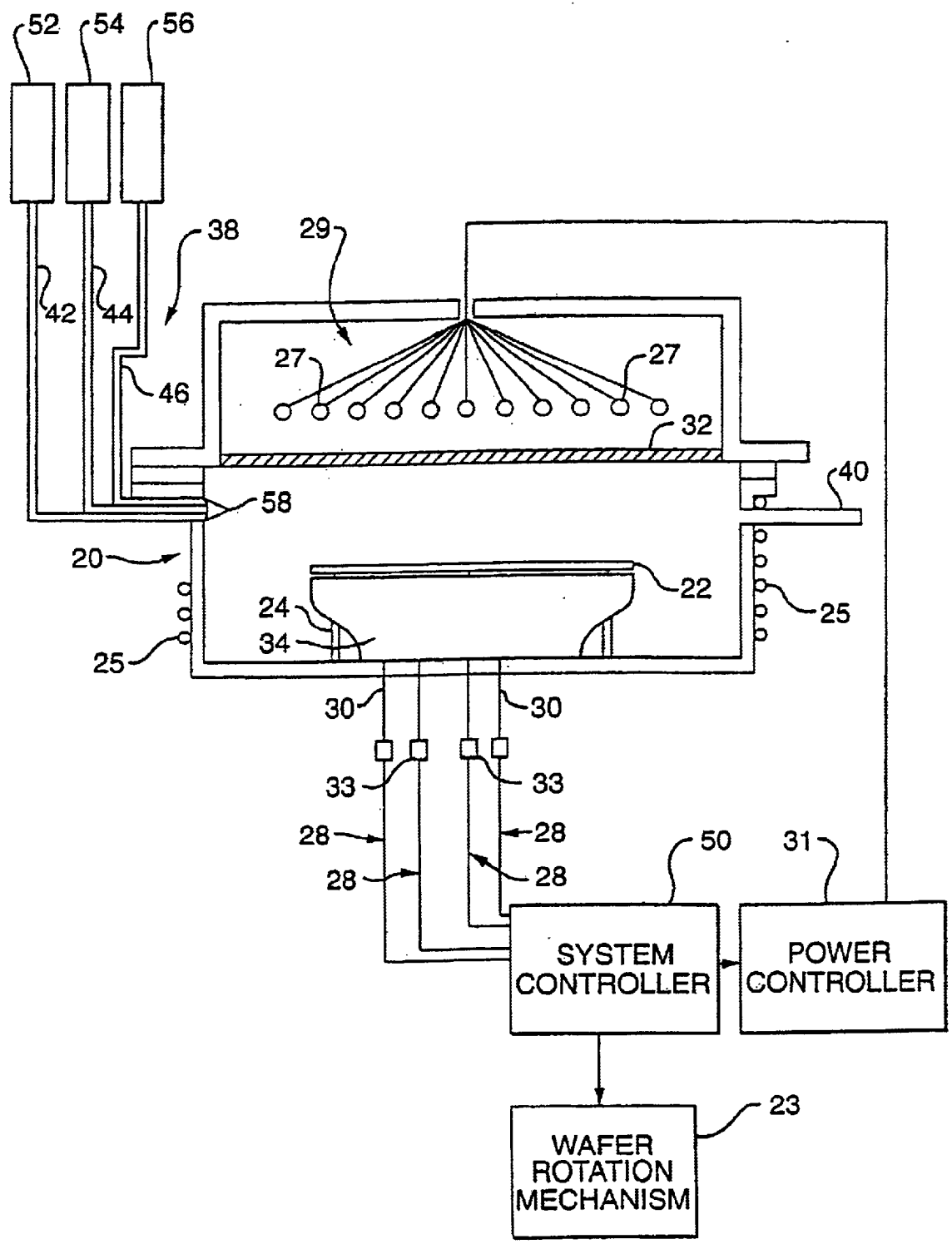
FIG. 1 is a cross sectional view of one embodiment of a thermal processing chamber that can be used in the process of the present invention.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention which broader aspects are embodied in the exemplary construction.

In general, the present invention Is directed to a process for forming thin layers in electronic devices, such as integrated circuit chips. According to the process of the present invention, a substrate, such as a semiconductor wafer, is placed in a reaction chamber. A precursor fluid, which can be a gas, a liquid vapor, or a mixture of gases and vapors, is introduced into the chamber and reacted or otherwise converted into a solid material on the substrate. Instead of using a continuous flow of the precursor fluid or reactant species as typically done in the past, the precursor fluid is pulsed into the chamber. For most applications, the precursor fluid is also introduced into the chamber at less than atmospheric pressure. In accordance with the present invention, every pulse of the precursor fluid inside the chamber is either reacted or purged out of the chamber before the next pulse. Every pulse of the precursor fluid therefore forms a very thin layer (a monolayer) on the substrate.

In order to form the solid layer from the precursor fluid, various energy sources can be used to heat the substrate, the precursor fluid, and the chamber ambient. For instance, in one embodiment, light energy sources can be used to emit light energy into the chamber. A combination of resistive heating, plasma, or microwave energy can also be used in conjunction with light energy in forming the solid layers.

A single layer on the substrate can be quickly formed from a combination of monolayers. Each monolayer successively deposits on a previously formed layer and fills any pinholes remaining in the structure. Further, light energy can be used to repair defects or stabilize the stoichiometry of the layer after it has been formed.

Various different types of layers can be formed in accordance with the present invention. For example, conductive layers, semiconductive layers and dielectric layers can be produced. Specific examples of layers that may be produced according to the present invention include barrier films and thin dielectric films for gate and capacitor stack or Damascene area. It is believed that electropolishing/electroplating functions can also be carried out according to the process of the present invention.

Referring to FIG. 1, one embodiment of a thermal processing chamber, generally 20 that may be used to carry out the process of the present invention is shown.

Thermal processing chamber 20 is adapted to receive a semiconductor wafer 22, for conducting various processes. In particular, thermal processing chamber 20 is designed to heat wafer 22 at very rapid rates and under carefully controlled conditions.

Thermal processing chamber 20 can be made from various materials including metals and ceramics. In one embodiment of the present invention, chamber 20 includes interior walls made from a nonconductive material, such as quartz. Alternatively, chamber 20 can be made from stainless steel. When the chamber 20 is made from a heat conductive material, however, the chamber can include a cooling system. For instance, as shown in FIG. 1, chamber 20 includes a cooling conduit 25 wrapped around the perimeter of the chamber. Conduit 25 is adapted to circulating cooling fluid, such as water, which is used to maintain the walls of the chamber at a constant temperature.

In this manner, the walls of the chamber are maintained at a lower temperature than the semiconductor wafer 22 during a heating cycle. As such, chamber 20 is referred to as a "cold walled" system. Of particular advantage, when using a cold walled chamber, reactants that are introduced into the chamber only react on the heated wafer, thus reducing the occurrence of any unwanted reactions and increasing the efficiency of the system.

As shown, wafer 22 is positioned within thermal processing chamber 20 on a substrate holder 24. During processing, substrate holder 24, in one embodiment, can be adapted to rotate wafer 22 using a wafer rotation mechanism 23. Rotating the wafer promotes greater temperature uniformity over the surface of the wafer and promotes enhanced contact between wafer 22 and any gases or liquid vapors being circulated through the chamber. It should be understood, however, that besides wafers, thermal processing chamber 20 is also adapted to process optical parts, films, fibers, ribbons, and other substrates having any particular shape.

In order to heat wafer 22, the system of the present invention includes a heat source 29 in communication with thermal processing chamber 20. In the embodiment illustrated, the heat source comprises a plurality of lamps 27, such as tungsten-halogen lamps, arc lamps, or a mixture of both. The lamps can be positioned above wafer 22 as shown in the figure, or can be placed above and below the wafer.

Further, if desired, lamps 27 can be surrounded by a reflector or a set of reflectors for directing thermal energy being emitted by the lamps onto wafer 22 at particular locations. Besides being placed above and below wafer 22, lamps 27 may be positioned at any other location within the thermal processing chamber.

The use of lamps 27 as a heat source is generally preferred. For instance, lamps have much higher heating and cooling rates than other heating devices, such as conventional furnaces. Lamps 27 create a rapid thermal processing system that provides instantaneous energy, typically requiring a very short and well controlled startup period. The flow of energy from lamps 27 can also be abruptly stopped at any time. Lamps 27 can be equipped with a gradual power controller 31 that can be used to increase or decrease the thermal energy being emitted by the lamps.

Besides a plurality of lamps 27, the system of the present invention can include other various energy sources to assist in the production of solid layers on wafer 22. For instance, the system can include plasma generators placed in association with any reactants being fed to the chamber and can include a microwave energy source. As shown in FIG. 1, the system can also include a thermal heating device 34, such as an electrical resistance heater, that is placed adjacent to the semiconductor wafer 22. Thermal heating device 34 can be used to heat the wafer continuously during the process. Further, the thermal heating device can preheat the wafer prior to introducing reactants into the system.

In order to monitor the temperature of wafer 22 during the heating process, in this embodiment, thermal processing chamber 20 includes a plurality of radiation sensing devices generally 28. Radiation sensing devices 28 include a plurality of optical fibers or light pipes 30 which are, in turn, in communication with a plurality of corresponding light detectors 33. Optical fibers 30 are configured to receive thermal energy being emitted by wafer 22 at a particular wavelength. The amount of sensed radiation is then communicated to light detectors 33 which generate a usable voltage signal for determining the temperature of the wafer which can be calculated based, in part, on Planck's Law. In one embodiment, each optical fiber 30 in combination with a light detector 33 comprises a pyrometer. In another embodiment, the optical fibers are routed to a single but multiplexing radiation sensing device.

In general, thermal processing chamber 20 can contain one or a plurality of radiation sensing devices. In a preferred embodiment, as shown in FIG. 1, thermal processing chamber 20 contains a plurality of radiation sensing devices that measure the temperature of the wafer at different locations. Knowing the temperature of the wafer at different locations can then be used to control the amount of heat being applied to the wafer as will be described in more detail hereinafter. The amount of heat applied to various zones of the wafer can also be controlled in an open loop fashion. In this configuration, the ratios between the various heating zones can be pre-determined after manual optimization. In subsequent processes, these ratios are used with no changes during the heating cycles.

During the process of the present invention, the system should be designed such that optical fibers 30 only detect thermal radiation being emitted by wafer 22 and not detect radiation being emitted by lamps 27. In this regard, the system can include a filter window 32 which prevents thermal radiation being emitted by lamps 27 at the wavelength light detectors 33 operate from entering chamber 20. Filter window 32 also serves to isolate lamps 27 from wafer 22 and prevent contamination of the chamber. Filter window 32 as shown in FIG. 1 can be a semitransparent plate positioned between the chamber and the heat source 29. In an alternative embodiment, each lamp 27 can be covered by a separate filter.

In one embodiment, filter window 32 is made from fused silica or quartz. Fused silica is known to absorb thermal radiation very effectively at selected wavelengths.

Besides using radiation sensing devices, other temperature sensing devices may be used in the system of the present invention. For instance, one or more thermocouples may be incorporated into the system for monitoring the temperature of the wafer at a single location or at a plurality of locations.

The system illustrated in FIG. 1 further includes a system controller 50 which can be, for instance, a microprocessor or other programable device. Controller 50 receives voltage signals from light detectors 33 that represent the radiation amounts being sampled at the various locations. Based on the signals received, controller 50 is configured to calculate the temperature of wafer 22 at different locations.

System controller 50 as shown in FIG. 1 can also be in communication with lamp power controller 31. In this arrangement, controller 50 can determine the temperature of wafer 22 and, based on this information, control the amount of thermal energy being emitted by lamps 27. In this manner, instantaneous adjustments can be made regarding the conditions within chamber 20 for processing wafer 22 within carefully controlled limits.

In one embodiment, controller 50 can also be used to automatically control other elements within the system. For instance, controller 50 can be used to control the flow rate of fluids entering chamber 20. Controller 50 can also be used to control the rate at which wafer 22 is rotated within the chamber. Further, the controller can also be used to control any other energy sources within the system, such as thermal heating device 34.

In accordance with the present invention, thermal processing chamber 20 further includes precursor fluid inlets 38 and a fluid outlet 40 for circulating one or more fluids into the chamber. For instance, a precursor fluid, such as a gas, a mixture of gases, a liquid vapor, or a mixture of liquid vapors, can be introduced into thermal processing chamber 20 which is designed to react with semiconductor wafer 22 for depositing a film or coating on the surface of the wafer. If desired, the precursor fluid entering thermal processing chamber 20 can be preheated or exposed to other various energy sources.

In the embodiment illustrated in FIG. 1, the system includes three separate fluid inlets 42, 44, and 46 which are in communication with corresponding fluid supplies 52, 54 and 56. Each fluid inlet is in communication with a nozzle 58. It should be understood, however, that the system can include less or more fluid inlets.

In general, it is desired for any fluids being introduced into the chamber to be uniformly dispersed over the surface of the wafer in order to promote the formation of a uniform coating. In this regard, thermal processing chamber 20 can include a dispersing device that directs and disperses the fluids over the surface of the wafer. For example, as shown in FIG. 1, each fluid inlet can be in communication with a nozzle. Alternatively, a perforated plate can be positioned over the top surface of the wafer. The perforated plate can include a plurality of holes through which the fluid is directed prior to contacting the wafer. In still another alternative embodiment, the fluids can be introduced into the chamber directly above the wafer.

In accordance with the present invention, a precursor fluid from one or more of the fluid inlets is pulsed into the thermal processing chamber 20 for forming a solid layer on semiconductor wafer 22. In particular, the precursor fluid is exposed to an energy source inside the chamber which causes the fluid to convert into a solid material. Once the precursor fluid is pulsed into the chamber, the fluid is either completely exhausted or purged from the chamber prior to the next pulse. In this manner, every pulse of the precursor fluid forms a very thin layer on the semiconductor wafer. Multiple pulses of the precursor fluid are used to form a layer having a desired thickness.

Of particular advantage, it is believed that this process will create layers having substantially no pinholes or defects. Further, it is believed that the process of the present invention will produce layers having a stabilized stoichiometry.

During the process of the present invention, the precursor fluid should be introduced into the chamber so as to minimize any excess fluid that may be present. For most applications, the concentration of the precursor fluid within the chamber should be at least 5 ppm. In order to facilitate the process of the present invention, preferably the reactants are introduced at a pressure that is less than atmospheric pressure (760 torr). For instance, the pressure within the chamber when the reactants are introduced can be less than about 5 torr, particularly less than about 3 torr, and more particularly less than about 1 torr. For example, the pressure can be from about $10^{-2}$ torr to about $10^{-7}$. In order to create a very low pressure environment, fluid outlet 40 can be used to create a substantial vacuum within the chamber.

During the process, inert gases can also be fed to the chamber in conjunction with the precursor fluid. The inert gases, such as nitrogen, helium or argon, can be fed to the chamber in order to prevent any unwanted side reactions, to minimize excess reactants, and to purge excess precursor fluid from the chamber. For example, in one embodiment, after the precursor fluid is pulsed into the chamber, an inert gas can be fed to the chamber for removing any of the precursor fluid that is not converted into a solid.

Various different types of layers can be formed in accordance with the present invention, depending upon the precursor fluid that is used. In this regard, the process of the present invention can be varied in order to optimize the properties of the formed layer. For example, in one embodiment, the light energy sources 27 can emit light energy substantially in synchronization with the precursor fluid. This embodiment is diagrammatically illustrated in FIG. 2.

Figure 2:
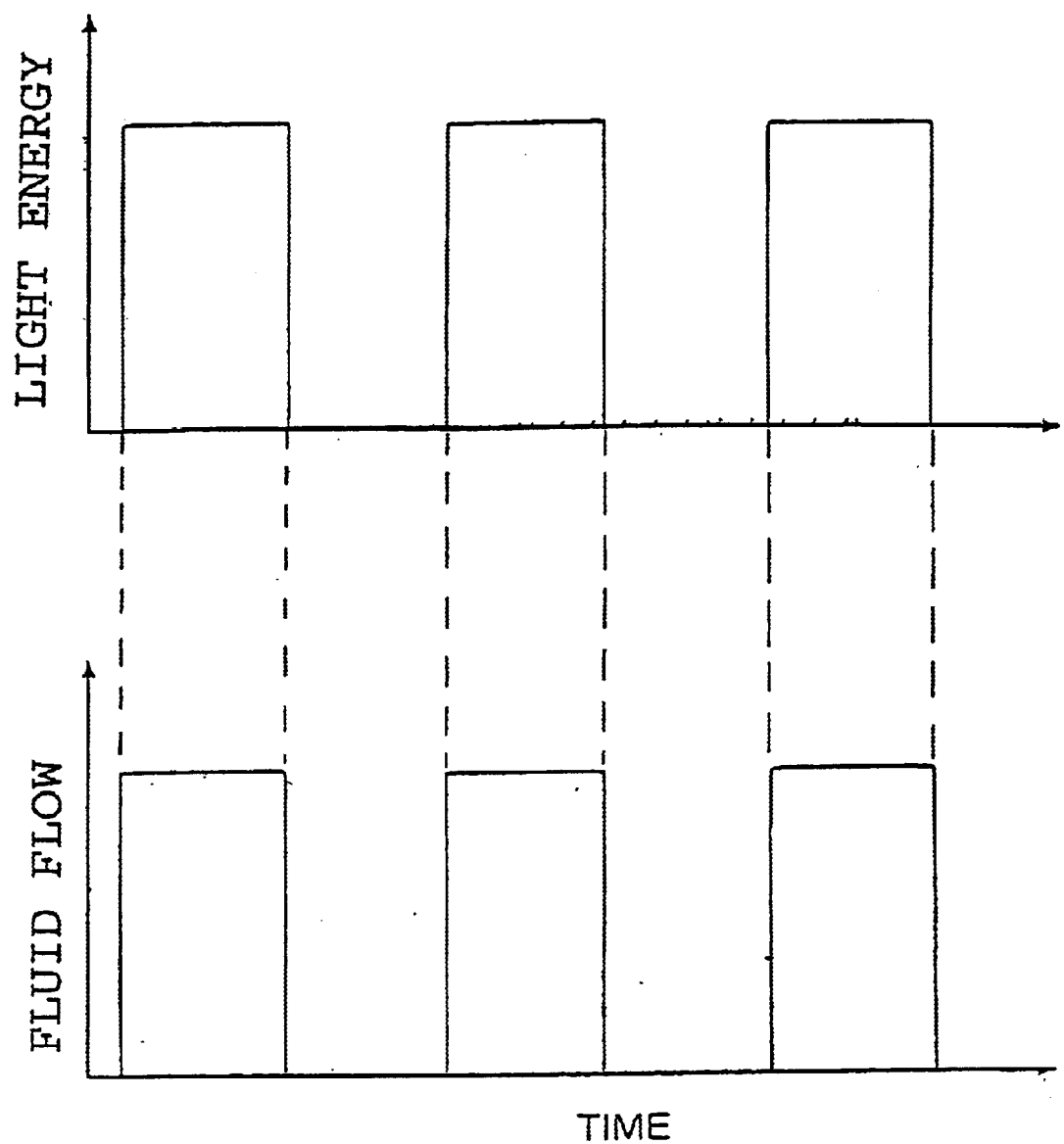
FIG. 2 is a diagram of one embodiment of a process in accordance with the present invention.

As shown in FIG. 2, a precursor fluid is intermittently introduced into the chamber. As the precursor fluid is pulsed into the chamber, light energy is simultaneously emitted into the chamber. The light energy is used to convert the precursor fluid into a solid which is deposited onto the semiconductor wafer. After each pulse of the precursor fluid, the amount of light energy emitted into the wafer is then decreased. In between pulses, the solid layer formed on the semiconductor wafer can be allowed to cool prior to forming a successive layer on the wafer. Further, the reaction chamber can also be purged during this time using, for instance, in inert gas. In one embodiment, the inert gas can be entered into the chamber at a temperature substantially lower than that of the semiconductor wafer for cooling the wafer and the solid layer just formed.

In an alternative embodiment of the present invention, the semiconductor wafer 22 can be preheated, using for instance, the electrical resistance heater 34. When the precursor is pulsed into the chamber, the fluid reacts with the semiconductor wafer which is at a elevated temperature. For example, the semiconductor wafer can be heated to a temperature of at least about 300° C. such as from about 300° C. to about 400° C.

In this embodiment, the electrical resistance heater is used to heat the wafer in order to form the solid layer. Once the layer is formed, light energy sources 27 can then be used to contact the layer with light energy. The light energy can be used to anneal the film or otherwise correct any defects that may have formed. The light energy can be emitted onto the solid layer during a purging step. Further, the light energy can be used in between each and every pulse or can be emitted into the chamber after several monolayers have been formed.

Figure 3:
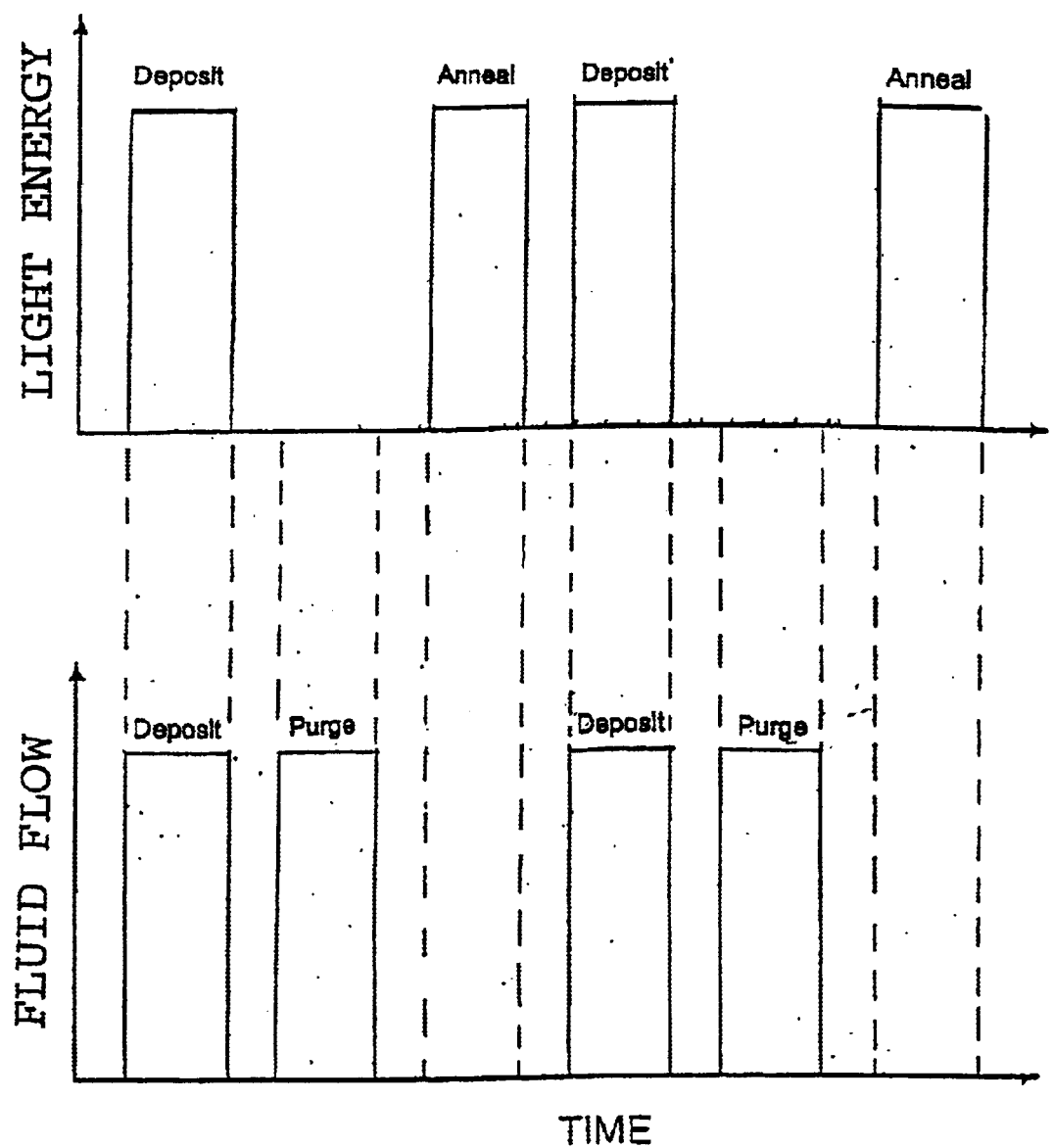
FIG. 3 is a diagram of an alternative embodiment of a process in accordance with the present invention.

A still further embodiment of the present invention is illustrated in FIG. 3. In this embodiment, the precursor fluid is pulsed into the reaction chamber synchronized with the emission of light energy similar to the embodiment illustrated in FIG. 2. After the precursor fluid is pulsed into the chamber and converted into a solid layer on the semiconductor wafer, an inert gas Is pulsed into the chamber in order to remove any non-reacted precursor fluid remaining in the chamber. After the reaction chamber is purged with an inert gas, the solid layer formed on the semiconductor wafer is then annealed using light energy. As shown, the process is then repeated in order to create a layer having a desired thickness on the wafer. During this process, the electrical resistance heater 34 illustrated in FIG. 1 can also be used to heat the wafer when desired.

During the process of the present invention, the temperature to which the semiconductor wafer is heated will vary depending upon the particular application. For most applications the temperature of the wafer during the deposition or during annealing should at least at 100° C. In other applications, the wafer will be heated to a temperature from about 400° C. to about 1200° C. Heating cycles in between formation of each monolayer will be very short. For instance, heating cycles will be typically less than a few minutes, such as less than one minute.

Figure 4:
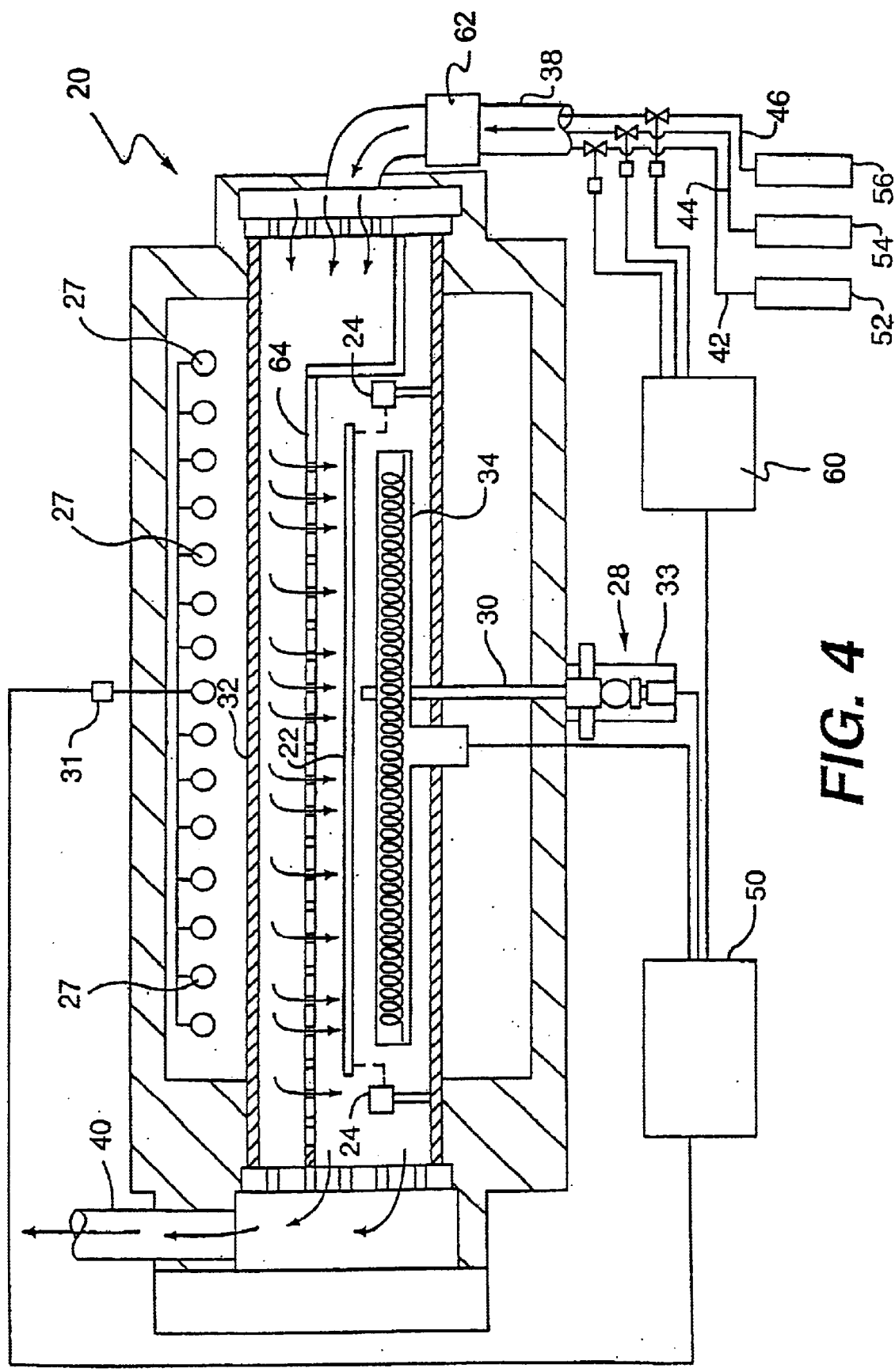
FIG. 4 is a cross sectional view of an alternative embodiment of a thermal processing chamber that can be used in the process of the present invention.

Referring to FIG. 4, an alternative embodiment of a system that may be used to carry out the process of the present invention is illustrated. As shown, the system is similar to the system illustrated in FIG. 1. This system, however, includes an electronic control box 60 for controlling the flow of fluids from fluid supplies 52, 54 and 56. Electronic control box 60 is, in turn, controlled by controller 50.

The embodiment illustrated in FIG. 4 also includes an energy source 62 that contacts the fluids prior to entering the thermal processing chamber 20. Energy source 62 can be a thermal energy source or any other type of energy source which will facilitate reaction of the precursor fluid with semiconductor wafer 22. For example, energy source 62 can be a plasma source, a microwave energy source, or ultraviolet light source.

Instead of a nozzle, the system illustrated in FIG. 4 further includes a dispersing device 64 for dispersing the precursor fluid over the surface of the wafer 22. In this embodiment, the dispersing device 64 is a perforated plate.

As described above, the process of the present invention is well suited to forming many different types of layers on the semiconductor wafer. The process of the present invention can be used to form conductive layers, semiconductor layers, and dielectric layers. In general, the precursor fluid can be any gas or vapor conventionally used in the past to form such layers.

When forming conductive layers, the precursor fluid can be, for instance, a hydride or an organometallic precursor. Conductive layers that may be formed according to the present invention include tungsten, tantalum nitride, titanium nitride, copper, tungsten nitride, aluminum, ruthenium oxide, iridium oxide, silver, and the like. Dielectric layers that can be formed according to the present invention include zirconium oxide, aluminum oxide, nitride, a silicate, a ternary compound, barium strontium titanate (BST) layers, SBT layers, and the like.

In one particular embodiment of the present invention, the process can be used to form a zirconium hafnium oxide layer. In this embodiment, a zirconium layer can first be formed on the semiconductor wafer. A hafnium layer can then be formed on top of the zirconium. Next, an oxidation process can be carried out for forming the final layer. This process can be completed all in a single chamber, or alternatively, the system of the present invention can include a multi-chamber system where each layer is deposited in a separate chamber.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A process for forming layers in electronic devices comprising the steps of:
    providing a reaction chamber, the reaction chamber comprising a cold wall chamber;
    placing a semiconductor wafer in said reaction chamber;
    heating said semiconductor wafer with a thermal heating device placed adjacent to said wafer to a temperature of at least about 300° C.;
    pulsing a precursor fluid into said reaction chamber, said precursor fluid forming a solid layer on said semiconductor wafer;
    purging said reaction chamber by flowing an inert gas through said reaction chamber after each pulse in order to substantially remove any of said precursor fluid not converted into a solid; and
    repeating the above steps a plurality of times in order to increase the thickness of the solid layer and wherein the process further comprises the step of annealing the solid layer multiple times during formation of the layer, the multiple annealing steps occurring after the reaction chamber is purged by the inert gas and prior to the next pulse of the precursor fluid, the solid layer being annealed by exposing the solid layer to thermal light energy, the light energy heating the solid layer to a temperature sufficient to anneal the layer.

2. A process as defined in claim 1, wherein said precursor fluid comprises a gas.

3. A process as defined in claim 1, wherein said thermal heating device comprises an electrical resistance heater.

4. A process as defined in claim 1, further comprising the step of maintaining said reaction chamber at a pressure of less than about 760 torr when pulsing said precursor fluid into said reaction chamber.

5. A process as defined in claim 1, further comprising the step of maintaining said reaction chamber at a pressure of less than about 3 torr when pulsing said precursor fluid into said reaction chamber.

6. A process as defined in claim 1, further comprising the step of maintaining said reaction chamber at a pressure of from about $10^{-2}$ torr to about $10^{-7}$ torr when pulsing precursor fluid into said reaction chamber.

7. A process as defined in claim 1, wherein said precursor fluid comprises a liquid vapor.

8. A process as defined in claim 1, wherein said thermal light energy is supplied by light energy sources positioned outside said reaction chamber.

9. A process as defined in claim 1, wherein said solid layer comprises a dielectric material.

10. A process as defined in claim 1, wherein said solid layer comprises a conductive material.

11. A process as defined in claim 1, wherein said solid layer comprises zirconium oxide.

12. A process as defined in claim 1, wherein said precursor fluid comprises a hydride.

13. A process as defined in claim 1, wherein said solid layer comprises a material selected from the group consisting of tungsten, tungsten nitride, tantalum nitride, titanium nitride, copper, aluminum, ruthenium oxide, iridium oxide, and silver.

14. A process as defined in claim 1, wherein said solid layer comprises a material selected from the group consisting of zirconium oxide, aluminum oxide, a nitride, barium strontium titanate and a silicate.

15. A process as defined in claim 1, wherein said solid layer comprises zirconium hafnium oxide.

16. A process as defined in claim 1, wherein the reaction chamber includes walls, the walls being made from an insulating material.

17. A process as defined in claim 16, wherein the insulating material comprises quartz.

18. A process as defined in claim 1, wherein the reaction chamber includes a cooling system for cooling the walls of the reaction chamber.

19. A process for forming layers in electronic devices comprising the steps of:
    providing a reaction chamber, the reaction chamber comprising a cold wall chamber;
    placing a substrate in said reaction chamber;
    pulsing a precursor fluid into said reaction chamber;
    exposing said precursor fluid to thermal light energy in said reaction chamber simultaneous with each pulse of the precursor fluid, the light energy causing said precursor fluid to convert into a solid layer on said substrate;
    after each pulse of the precursor fluid, decreasing the amount of thermal light energy and purging the reaction chamber by flowing an inert gas through the reaction chamber, the inert gas cooling the solid layer and substantially removing any of the precursor fluid not converted into a solid; and
    wherein between selected pulses of the precursor fluid and after cooling, annealing the solid layer by exposing the solid layer to thermal light energy prior to the next pulse, the light energy heating the solid layer to a temperature sufficient to anneal the layer.

20. A process as defined in claim 19, further comprising the step of maintaining said reaction chamber at a pressure of less than about 5 torr when pulsing said precursor fluid into said reaction chamber.

21. A process as defined in claim 19, wherein the reaction chamber includes walls, the walls being made from an insulating material.

22. A process as defined in claim 19, wherein the reaction chamber includes a cooling system for cooling the walls of the reaction chamber.

23. A process as defined in claim 19, wherein the solid layer is annealed after each pulse of the precursor fluid.

* * * * *